(12) United States Patent
Nomoto

(10) Patent No.: US 6,185,488 B1
(45) Date of Patent: Feb. 6, 2001

(54) DIAGNOSING APPARATUS FOR PASSENGER PROTECTIVE SYSTEMS

(75) Inventor: Kazuo Nomoto, Toyokawa (JP)

(73) Assignee: Denso Corporation, Kariya (JP)

( * ) Notice: Under 35 U.S.C. 154(b), the term of this patent shall be extended for 0 days.

(21) Appl. No.: 09/053,619

(22) Filed: Apr. 2, 1998

(30) Foreign Application Priority Data

Apr. 4, 1997 (JP) .................................................. 9-102627

(51) Int. Cl.[7] .................................. G05D 3/00; G06F 7/00
(52) U.S. Cl. .................................. 701/29; 701/31; 701/45; 102/215; 102/217; 180/271; 180/286; 324/537
(58) Field of Search .................................. 701/29, 31, 45; 361/1, 3, 7; 280/735, 728.1, 734; 340/635, 657, 436, 457.1, 459, 636, 438, 661, 664, 669; 116/202, 28 R; 102/206, 202.5, 215; 307/10.1, 10.6; 180/271, 282, 273, 272, 286; 202/217; 324/500, 502, 537

(56) References Cited

U.S. PATENT DOCUMENTS

| | | | |
|---|---|---|---|
| 4,243,971 | | 1/1981 | Suchowerskyj et al. ............. 340/438 |
| 5,343,394 | * | 8/1994 | Takeuchi et al. ...................... 701/45 |
| 5,351,185 | * | 9/1994 | Takeuchi et al. ...................... 701/45 |
| 5,381,334 | * | 1/1995 | Furui ....................................... 701/45 |
| 5,406,127 | * | 4/1995 | Furui et al. .......................... 307/10.1 |
| 5,409,258 | * | 4/1995 | Kawabata ............................. 280/735 |
| 5,564,737 | * | 10/1996 | Ito et al. ............................... 280/735 |
| 5,596,497 | * | 1/1997 | Honda ..................................... 701/45 |
| 5,621,326 | * | 4/1997 | Watanabe et al. .................... 324/502 |
| 5,659,474 | * | 8/1997 | Maeno et al. .......................... 701/45 |
| 5,675,242 | * | 10/1997 | Nakano ................................. 280/734 |
| 5,677,838 | * | 10/1997 | Itou et al. ................................ 701/45 |
| 5,796,177 | * | 8/1998 | Werbelow et al. .................. 307/10.1 |
| 5,805,058 | * | 9/1998 | Saito et al. ............................ 280/735 |
| 5,806,008 | * | 9/1998 | Takeuchi ................................. 701/45 |
| 5,811,978 | * | 9/1998 | Tsubone ................................. 324/678 |
| 5,861,681 | * | 1/1999 | Nakano et al. ......................... 701/45 |
| 5,892,450 | * | 4/1999 | Scoones et al. ...................... 340/664 |
| 5,898,122 | * | 4/1999 | Davis et al. .......................... 280/735 |
| 5,995,891 | * | 11/1999 | Mayumi et al. ........................ 701/45 |
| 5,995,892 | * | 11/1999 | Kiribayashi et al. .................. 701/45 |

FOREIGN PATENT DOCUMENTS

| | | |
|---|---|---|
| 63-207755 | 8/1988 | (JP) . |
| 3-121952 | 5/1991 | (JP) . |

* cited by examiner

*Primary Examiner*—Jacques H. Louis-Jacques
(74) *Attorney, Agent, or Firm*—Pillsbury Madison & Sutro LLP

(57) ABSTRACT

A diagnosing apparatus for a passenger protective system has transistors connected in series to both ends of a squib. Each of the transistors is made up of a plurality of transistor cells connected in parallel. A part of the transistor cells is utilized as a check transistor, which allows a small current incapable of igniting the squib to flow into the squib. The diagnosing apparatus turns on only the check transistor and detects a potential of the squib. Check transistor malfunction can be diagnosed on the basis of the detected potential. Because the check transistor is formed by a part of the transistor cells, if any trouble occurs therein, it can be considered that the power transistor formed by the remainder of the transistor cells also has any trouble. Therefore, the power transistor can be diagnosed from the detected potential of the squib.

28 Claims, 5 Drawing Sheets

DIAGNOSING APPARATUS FOR PASSENGER PROTECTIVE SYSTEMS

CROSS REFERENCE TO RELATED APPLICATION

This application is based upon and claims priority from Japanese Patent Application No. H. 9-102627 filed Apr. 4, 1997, the contents of which are incorporated herein by reference.

BACKGROUND OF THE INVENTION

1. Field of the Invention

The present invention relates to a trouble diagnosing apparatus for passenger protective systems which are deployed at the time of a vehicle collision to protect passengers.

2. Description of the Related Art

Conventionally, a circuit, as shown in FIG. 7, for activating a passenger protective system such as an airbag system or a seatbelt retractor is well known. In this circuit, transistors 31, 34 are connected in series to the both ends of a squib 33. When the two transistors 31, 34 simultaneously turn on, a large current flows through the squib 33 so that the squib 33 is ignited.

To ensure the reliability of the passenger protective system, it is diagnosed, either periodically or at the time of an engine start, whether the transistors 31, 34 normally turn on in response to respective turn-on signals. In this diagnosis, the transistor 31 is determined to be normal if the potential of the squib 33 (the potential of the intermediate point M, hereinafter referred to as an intermediate point potential) becomes equal to a power source potential when only the transistor 31 is turned on. If not, the transistor 31 is determined to be abnormal. Also, the transistor 34 is determined to be normal if the intermediate point potential becomes equal to a ground potential when only the transistor 34 is turned on. If not, the transistor 34 is determined to be abnormal.

During this diagnosis, if a line L2 is being short-circuited to ground, or if a line L1 is being short-circuited to a power supply line, a large current is supplied to the squib 33, and thereby the squib 33 is erroneously ignited. To solve this problem, as shown in FIG. 7, resistors 32 and 35 are respectively connected in parallel to the transistors 31, 34. The intermediate point potential is detected while the transistors 31, 34 are being turned off to determine in advance the occurrence of short-circuits of the lines L1 and L2. If no short-circuits have occurred, the diagnosis is then carried out. That is, unless short-circuits occur in the lines, the intermediate point potential is an approximate V/2 (V: power source potential) since the power source potential V is divided by the resistors 32, 35.

To the contrary, if the line L2 is short-circuited to ground, the intermediate point potential is an approximate ground potential. Also, if the line L1 is short-circuited to the power supply line, the intermediate point potential is an approximate power source potential. Therefore, the short-circuits of the lines L1, L2 can be detected based on the intermediate point potential.

The intermediate point potential is, however, detected on the basis of either instantaneously sampled voltages or an average voltage at the intermediate point M. Therefore, in a case where the line L1 or the line L2 instantaneously and repeatedly makes contact with the power supply line or ground, such a short-circuit of the line L1 or the line L2 cannot be detected. For this reason, while the diagnosis is carried out and the transistors 31, 34 are alternately turned on, if the line L1 makes contact with the power supply line, or if the line L2 makes contact with ground, the large current instantaneously flows through the squib 33, thereby causing the squib 33 to ignite erroneously.

SUMMARY OF THE INVENTION

Accordingly, it is an object of the present invention to provide a diagnosing apparatus for a passenger protective system which can prevent an igniting current from flowing through a squib even when either one of two ends of the squib is short-circuited to ground or a power supply.

In order to achieve the above-mentioned object, according to the present invention, the diagnosing apparatus for the passenger protective system includes a power transistor connected in series to at least one end of a squib. The power transistor is made up of a plurality of transistor cells connected in parallel. The diagnosing apparatus for the passenger protective system utilizes a part of the transistor cells as a check transistor which allows a small current incapable of igniting the squib to flow into the squib. The diagnosing apparatus turns only the check transistor on to detect a potential of the squib. The trouble of the check transistor can be diagnosed on the basis of the detected potential. Because the check transistor is formed by a part of the transistor cells, if any trouble occurs therein, it can be considered that the power transistor formed by the remainder of the transistor cells also has trouble. Such trouble may be caused by a defective cell or a faulty connection at a gate electrode, a source electrode or a drain electrode of the power transistor. Therefore, the power transistor can be diagnosed from the detected potential of the squib. Further, because the check transistor allows only a small current incapable of igniting the squib to flow into the squib, even if a line connected to one end of the squib is instantaneously and repeatedly short-circuited to ground or a power supply, erroneous ignition of the squib can be prevented due to the check transistor being turned on.

Preferably, the power transistors including the check transistor are provided on both sides of the squib. In this case, because the igniting current flows through squib by way of the turned on power transistors, a large current can be easily supplied to the squib. In addition, even when one of two power transistors fails so that the power transistor allows the igniting current to flow into the squib, the ignition of the squib can be prevented due to another normally operating power transistor.

Several check transistors can be defined in the plurality of transistor cells of the power transistor. In this case, it is preferable to cause the several check transistors to turn on one by one in order to determine whether each of the several check transistors is normal or abnormal. As a result, because a large area (a plurality of cells) of the power transistor can be actually diagnosed, reliability of the diagnosis for the power transistor can be further enhanced.

In addition, the check transistor may be turned on along with the power transistor when the squib is to be ignited. Due to this fact, it is possible to effectively utilize a current flow capacity of the power transistor.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

DETAILED DESCRIPTION OF THE PREFERRED EMBODIMENTS

Embodiments of the present invention will now be explained with reference to the drawings.

Figure 1:
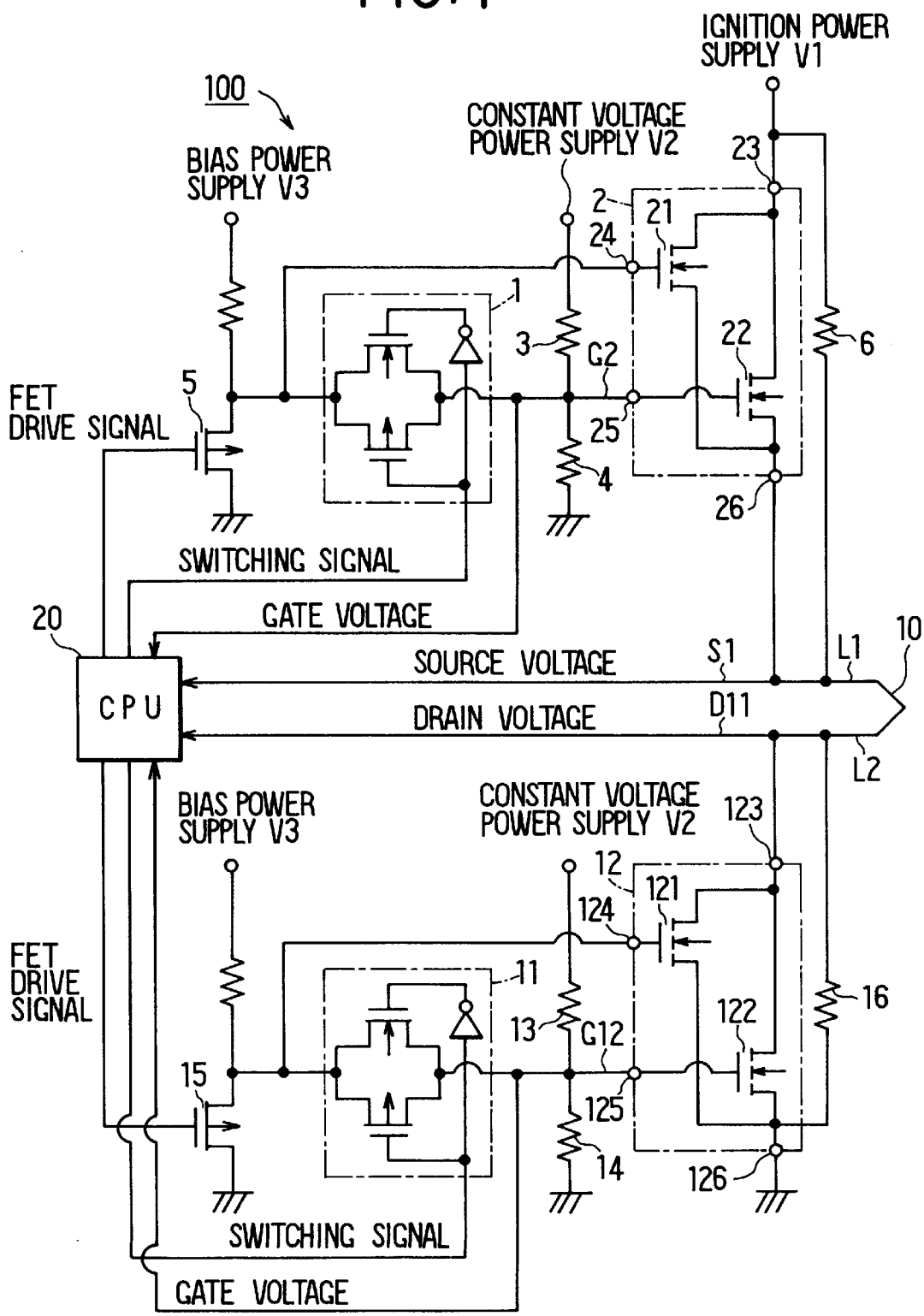
FIG. 1 is a circuit diagram illustrating a diagnosing apparatus for a passenger protective system according to a first embodiment of the present invention.

FIG. 1 is a circuit diagram illustrating a diagnosing apparatus 100 for an airbag system (passenger protective system) according to a first embodiment of the present invention. The airbag system protects a passenger from an impact caused by an vehicle collision by deploying an air-bag toward the passenger. When an igniting current flows through a squib 10, a low explosive is burned by the squib 10. As a result, gas is generated by the burning of the low explosive that thereby inflates the air bag.

One end of the squib 10 is connected to an igniting power supply V1 via a circuit in which a field effect transistor (FET) 2 and a resistor 6 are connected in parallel. The other end of the squib 10 is connected to ground via a circuit in which a FET 12 and a resistor 16 are connected in parallel. The resistors (compensation resistors) 6, 16 have resistance values such that the current flowing through the squib 10 has a current value of the degree to which the current does not ignite the squib 10, even when either one of the FETs 2, 12 has turned on.

Figure 3:
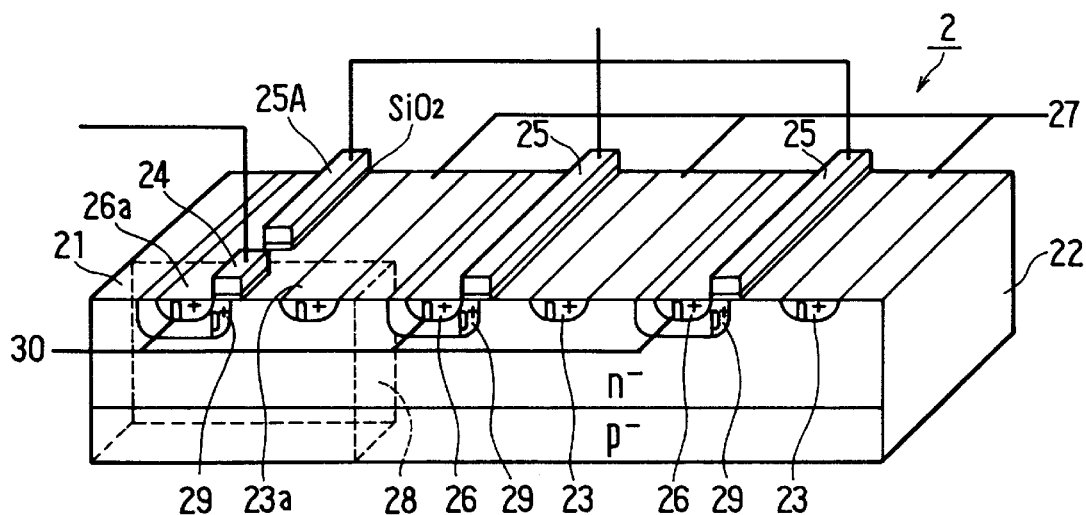
FIG. 3 is a perspective view illustrating a first example of a field effect transistor (FET) used in the diagnosing apparatus.

The FETs 2, 12 both have a lateral-type double-diffusion MOS structure (LDMOS). A perspective view of the FET 2 is shown in FIG. 3. It is to be noted that the FET 12 has the same structure as the FET 2.

The FET 2 is of an n-channel enhancement-type. That is, when a voltage between a gate and a source (gate voltage) is less than a threshold value Vth, the FET 2 is in an off state (normally off). Conversely, when the gate voltage is greater than or equal to the threshold value Vth, the FET 2 is in an on state.

The FET 2 includes a plurality of cells disposed in line on a substrate. Each of the cells are made up of a drain region 23, a source region 26 and a gate region 29 which are formed in the surface of an n⁻-type layer of the substrate. On the gate region 29, a gate electrode 25 is formed interposing an SiO₂ film therebetween. However, in the cell including an end drain region 23a, the gate electrode is divided into a gate electrode 24 and gate electrode 25X which are isolated from each other. All of the drain regions 23 are connected to the igniting power supply V1 by way of a drain connecting line 27. The drain connecting line 27 is formed by, for example, an aluminum layer formed on the substrate. All of the source regions 26 are connected to one end of the squib 10 by way of a source connecting line 30. The source connecting line 30 is also formed by, for example, an aluminum layer.

A check-use FET 21 is formed by a cell region disposed under the divided gate electrode 24. That is, the check FET 21 is defined in a region 28 outlined by a dotted line in FIG. 3. A drive-use FET 22 includes a plurality of cells other than the cell region for the check-use FET 21 in the FET 2. The plurality of cells forming the drive-use FET 22 are connected in parallel by the drain connecting line 27 and the source connecting line 30. The check-use FET 21 has a higher on-resistance than the drive-use FET 22. In this embodiment, the on-resistance of the check-use FET 21 is set to about 250 Ω.

FETs 5, 15 are provided in order to turn on and off the FETs 2, 12. The drain, source, and gate of each of the FETs 5, 15 are connected to a bias power supply V3, to ground, and to a CPU 20, respectively. The FETs 5, 15 are of a p-channel depletion-type. Therefore, when a drive signal from the CPU 20 is a low level signal, the FETs 5, 15 are in an on state. Conversely, when the drive signal from the CPU 20 is a high level signal, the FETs 5, 15 are in an off state.

Analog switches 1, 11 composed of an inverter and a plurality of FETs are disposed between the drains of the FETs 5, 15 and the gates of the FETs 22, 122, respectively. The analog switches 1, 11 are turned on and off in response to switching signals from the CPU 20. Resistors 3, 4 and resistors 13, 14, which are respectively connected in series to a constant voltage power supply V2, are disposed between the analog switches 1, 11 and the gates of the FETs 22, 122 to monitor the operating states of the analog switches 1, 11. The resistance values of the resistors 3, 4 and resistors 13, 14 are selected so that, when the analog switches 1, 11 turn off, the gate voltages of the FETs 22, 122 are about 1 V lower than the threshold voltage Vth.

The CPU 20 provides the drive signals that cause the FETs 5, 15 to turn on and off, and the switching signals that cause the analog switches 1, 11 to turn on and off. The CPU 20 also monitors the gate voltages G2, G12 of the FETs 22, 122, the source voltage S1 of the FET 22, and the drain voltage D11 of the FET 122.

Figure 2:
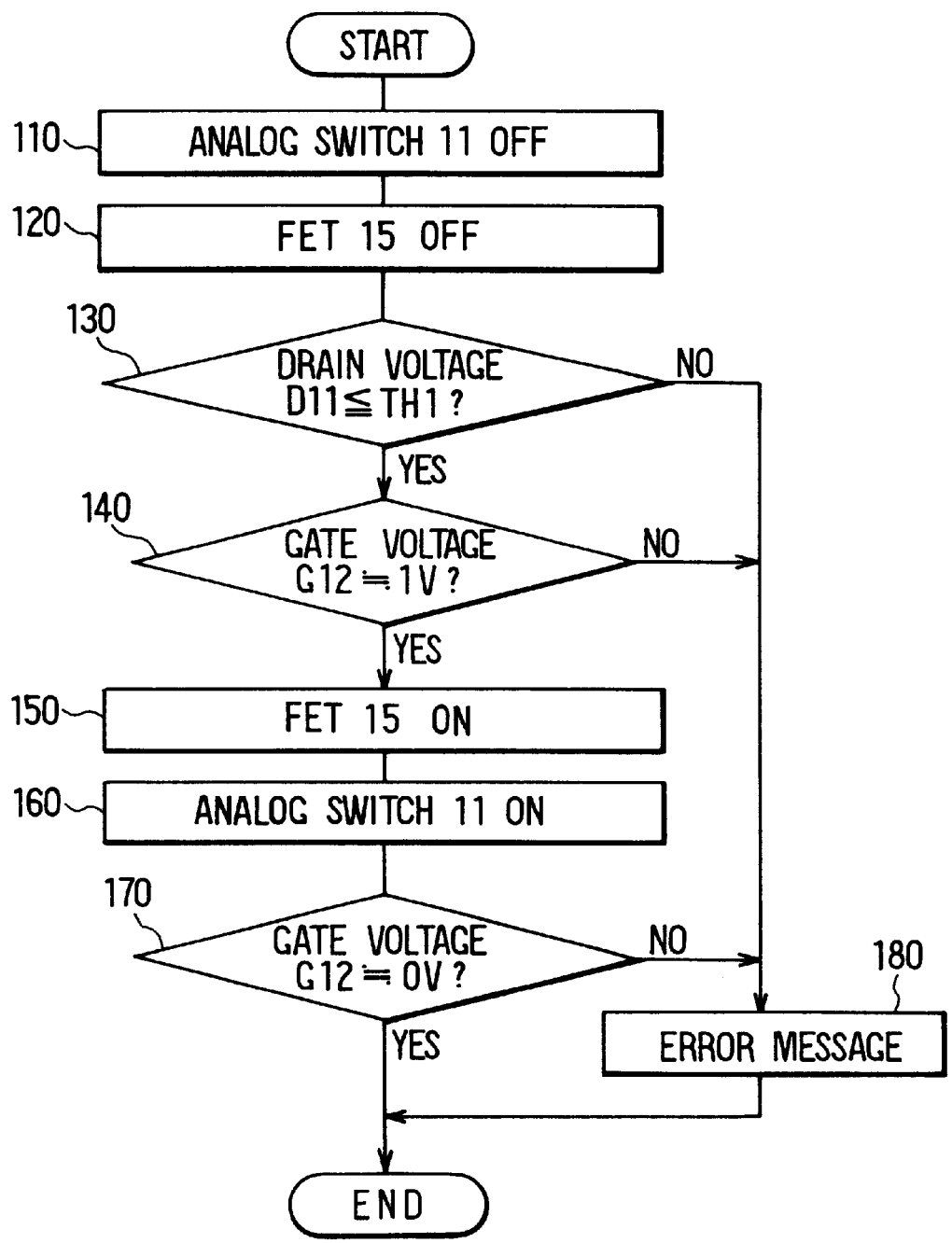
FIG. 2 is a flow diagram illustrating a flow of processing carried out by a central processing unit (CPU) shown in FIG. 1.

Next, the operation of the diagnosing apparatus 100 will be described with reference to FIG. 2. FIG. 2 is a flow diagram illustrating processing of the CPU 20 carried out for the low-side FET 12. The processing starts in response to a vehicle ignition switch being turned on. When the vehicle ignition switch is turned off, the CPU 20 does not operate. Therefore, while the vehicle ignition switch is being turned off, the ignition current does not flow through the squib 10, and there is no possibility that the airbag system is erroneously activated.

When the ignition switch is turned on, electric power is supplied to the CPU 20. At step 110, the CPU 20 provides a switching signal to the analog switch 11 to turn it off. As a result, communication between the drive-use FET 122 and the bias power supply V3 is interrupted. Next, at step 120, the CPU 20 provides the FET 15 with a high-level signal as the FET drive signal to change the state of the FET 15 from the on state to the off state. As a result, a positive voltage greater than the threshold voltage Vth due to the bias power supply V3 is applied to the gate electrode 124 of the check-use FET 121 so that the check-use FET 121 changes to the on state.

Subsequently, at step 130, it is determined whether the drain voltage D11 is less than or equal to a predetermined threshold value TH1. Because current flows between the drain and source of the check-use FET 121 when the FET 121 is turned on, if the check-use FET 121 is normal, the drain voltage D11 cannot be greater than the threshold value TH1. Therefore, when an affirmative determination is made at step 130, it is determined that the check-use FET 121 can be normally turned on, and the processing advances to step 140.

At step 140, it is determined whether the gate voltage G12 of the drive-use FET is about 1 V. When the analog switch 11 is normally turned off, the gate voltage G12 increases to about 1 V. Therefore, when an affirmative determination is made at step 140, it can be determined that the analog switch 11 functions normally (i.e., normally turns off), and the processing advances to step 150. At step 150, the CPU 20 provides the FET 15 with a low-level signal as the FET drive signal to change the state of the FET 15 from the off state to the on state. Because the bias power supply V3 is grounded via a resistor and the FET 15 turned on, the voltage impressed on the gate electrode 124 of the check-use FET 121 becomes approximately zero, so that the state of the FET 121 changes from the on state to the off state.

Next, at step 160, the CPU 20 provides the analog switch 11 with a switching signal to change the state of the analog switch 11 from the off state to the on state. As a result, the gate electrode 125 of the drive-use FET 122 is grounded via the FET 15. Thereafter, at step 170, it is determined whether the gate voltage G12 of the drive-use FET 122 is approximately zero. If the analog switch 11 is normal and switches to the on state in response to the switching signal, the gate voltage G12 is substantially zero. Therefore, when an affirmative determination is made at step 170, it is determined that the analog switch 11 does not fail, and the processing is terminated.

When a negative determination is made in step 130, that is, when both the analog switch 11 and the FET 15 are in the off state and thereby the check-use FET 121 should be in the on state, if the drain voltage D11 is greater than the threshold voltage TH1, it can be determined that the check-use FET 121 erroneously remains turned off. Therefore, in this case, an error message is treated at step 180. Also, when a negative determination is made at step 140, that is, when the gate voltage G12 of the drive-use FET 122 is not about 1 V, it can be determined that the analog switch 11 is not functioning properly. In this case also, an error message is shown at step 180, and the processing is terminated. Further, when a negative determination is made at step 170, that is, when the gate voltage G12 of the drive-use FET 122 is not approximately zero despite the FET 15 being switched to the on state, it can be determined that the analog switch 11 is not functioning properly (on-operation failure). In this case as well, the error message is shown at step 180, and the processing is terminated.

In this way, the diagnosing apparatus checks whether the low side FET 12 is operating normally. Also, after the above described processing has been terminated, the operation of the high side FET 2 will be checked by the diagnosing apparatus in the same way.

After the operation check as described above, the FETs 5, 15 and the analog switches 1, 11 are maintained in the on state. As a result, each of gate voltages of the drive-use FETs 22, 122 and the check-use FETs 21, 121 is about zero so that the FETs 22, 122 and 21, 121 are maintained in an off state. In this state, when the CPU 20 detects a vehicle collision, the FETs 5, 15 change from the on state to the off state. As a result, the bias voltage V3 is impressed on each of gates electrodes of the drive-use FETs 22, 122 and the check-use FETs 21, 121, so that the state of each of the FETs 22, 122 and 21, 121 changes from the off state to the on state. As a result, an ignition current flows through the squib 10, and the airbag system is activated.

In the diagnosing apparatus, because a part of the plurality of cells constituting each of the FETs 2, 12 is utilized as the check-use FETs 21, 121 of a high resistance, even when the connecting line L1 or the connecting line L2 is instantaneously or constantly short-circuited to a power supply line or to ground, respectively, the current flowing through the squib 10 is limited by the check-use FETs 21, 121. Therefore, the current flowing through the squib 10 does not increase to ignite the squib 10. For this reason, it is possible to prevent the airbag system from erroneously being deployed.

Because the end drain region 23a of the drain regions 23 is used as a drain region of the check-use FET 21, if a disconnection has occurred at the drain connecting line 27, which connects the drain regions 23 of the drive-use FET 22, the check-use FET 21 cannot be turned on. Therefore, the disconnection of the drain connecting line 27 can be detected as the trouble of the check-use FET 21. In the first embodiment, although a first source region 26a of the source regions 26 is used as a source region of the check-use FET 21, the check-use FET 21 can comprise the end drain region 23a and an end source region by connecting an end of the source connecting line 30 to the first source region 26a. Because the FET 12 has the same structure as that of the FET 2, the disconnection of the drain connecting line and/or source connecting line can be detected as the trouble of the check-use FET 121.

Because each of the check-use FETs 21, 121 is formed by a part of the plurality of cells of each of the FETs 2, 22, if any trouble occurs in the check-use FET 21 and/or 121, it can be considered that the drive-use FET 22 and/or 122 formed by the remainder of the plurality of cells is malfunctioning. Therefore, the drive-use FETs 22, 122 can be diagnosed by checking the operation of the check-use FETs 21, 121.

Further, by monitoring the gate voltages G2, G12 of the drive-use FETs 22, 122, failures of the analog switches 1, 11 can be detected. Therefore, the safety of the diagnosing apparatus 100 can be enhanced.

In the first embodiment, although the drain voltage D11 was compared with the threshold voltage TH1 at step 130, it may be determined whether the change of the drain voltage D11 is more than a predetermined value when the check-use FET 21 is switched from the off state to the on state. Also, in the first embodiment, although the check-use FETs 21, 121 were alternately turned on to detect the source voltage S1 and the drain voltage D11, the check-use FETs 21, 121 may be simultaneously turned on. In this case, it is determined whether a voltage across the squib 10 is more than a predetermined value. It is to be noted that even when the check-use FETs 21, 121 are simultaneously turned on, the igniting current does not flow through the squib 10 because the check-use FETs 21, 121 have a high resistance.

Figure 6A:
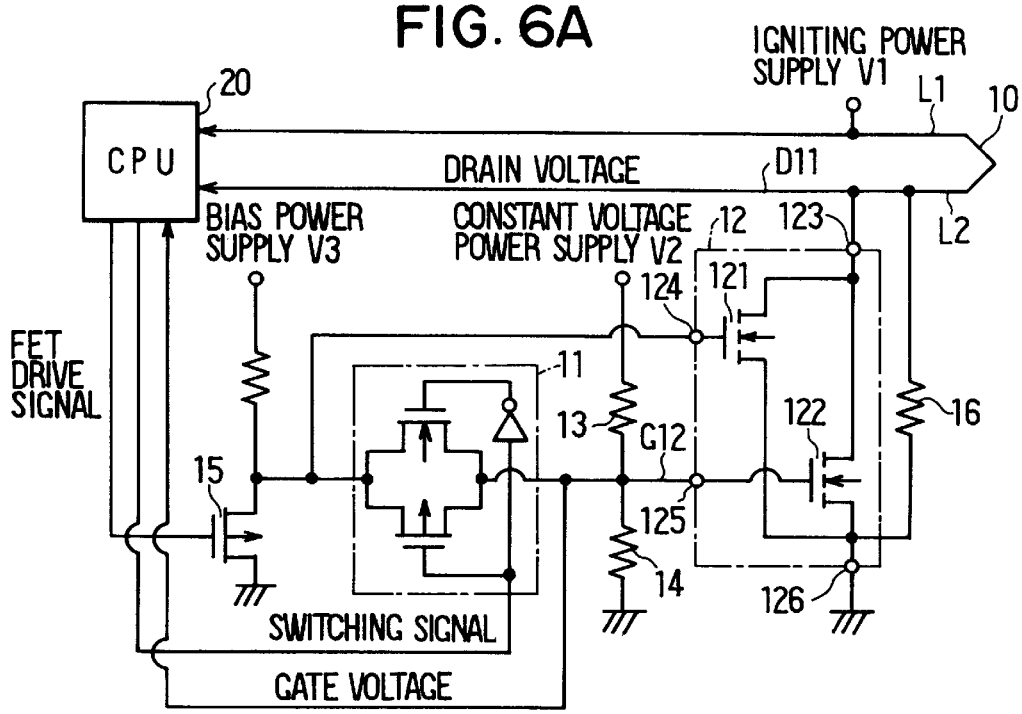
FIGS. 6A and 6B are circuit diagrams illustrating modifications of the diagnosing apparatus for the passenger protective system.
Figure 6B:
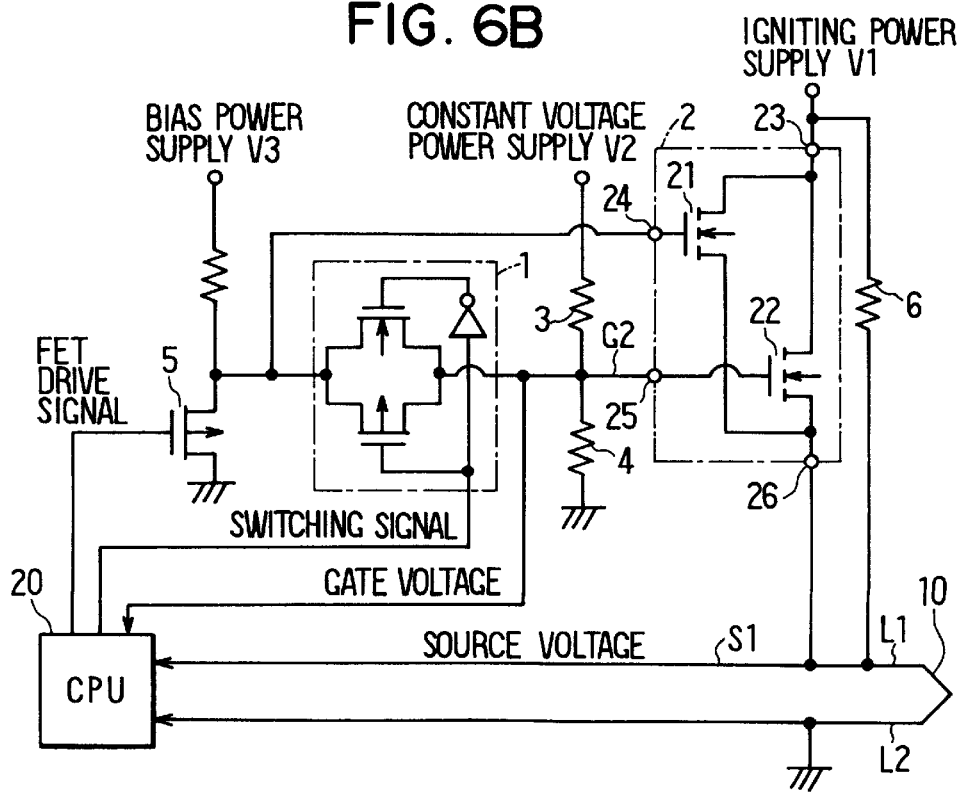

In the first embodiment, the FETs 2, 12 were provided on both sides of the squib 10 as shown in FIG. 1. However, the FET may be provided on either side of the squib 10. That is, as shown in FIG. 6A, the FET 12 may be provided only on an ground side of the squib 10. Conversely, as shown in FIG. 6B, the FET 2 may be provided only on an ignition power supply side of the squib 10. When either of the FETs 2, 12 is disposed in the vicinity of the squib 10, because the connecting line L1 between the squib 10 and the FET 2, or the connecting line L2 between the squib 10 and the FET 12, becomes shorted, the possibility of the connecting line L1 being short-circuited to the power supply line or the connecting line L2 being short-circuited to ground becomes small. The trouble of each of the FETs 2, 12 can be detected based on the change of the source voltage S1 and the drain voltage D11, or the voltage across the squib 10 when the check-use FETs 21, 121 are turned on, respectively.

Figure 4:
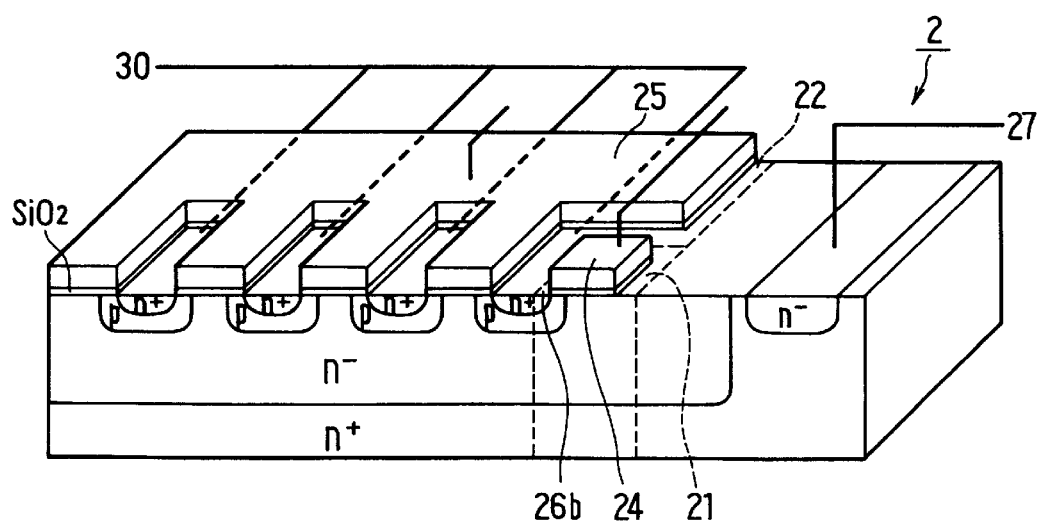
FIG. 4 is a perspective view illustrating a second example of the FET used in the diagnosing apparatus.

In the first embodiment, although the FETs 2, 12 are of the LDMOS structure, the FETs 2, 12 may be of a vertical-type double-diffusion MOS (VDMOS) structure as shown in FIG. 4. FIG. 4 shows the VDMOS structure of the FET 2 as an example, but the structure of the FET 22 is the same as that of the FET 2. In this case, an end source region 26b of the source regions 26 is used as a source region of the check-use FET 2. Therefore, if a disconnection has occurred at the source connecting line 30, which connects the source regions 26 of the drive-use FET 22, the check-use FET 21 cannot be turned on. Therefore, the disconnection of the source connecting line 30 can be detected as the trouble of the check-use FET 21.

Figure 5:
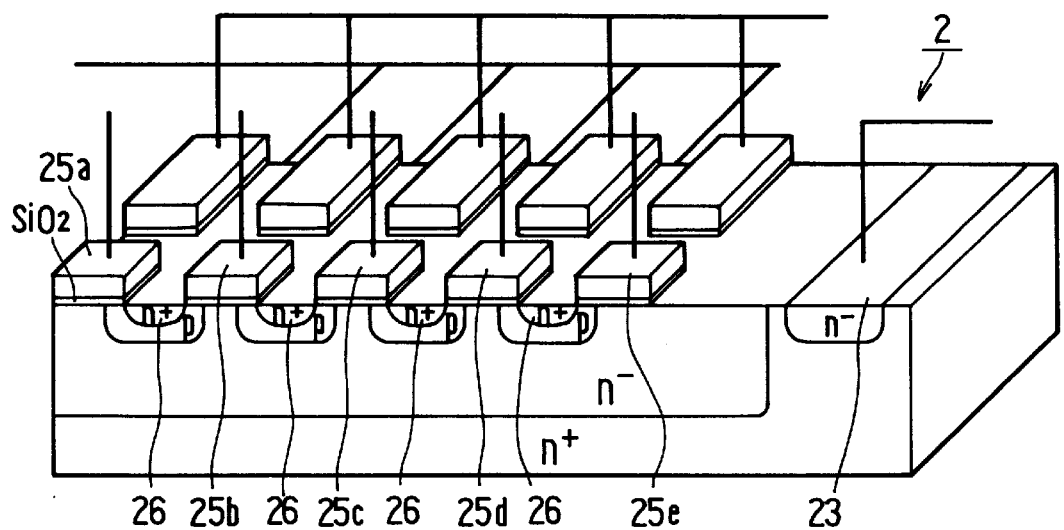
FIG. 5 is a perspective view illustrating a second example of the FET used in the diagnosing apparatus.
Figure 7:
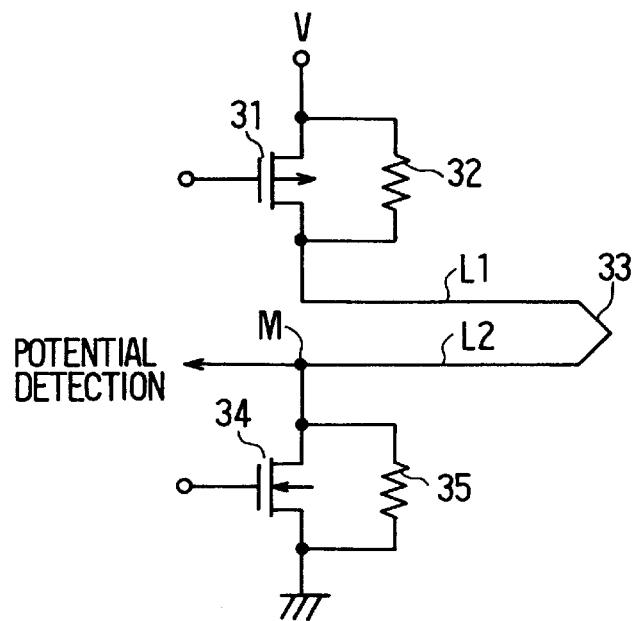
FIG. 7 is a circuit diagram illustrating a conventional diagnosing apparatus for the passenger protective system.

In the first embodiment, the FETs 22, 122 are divided into the check-use FETs 21, 121, each of which is formed by a part in a single cell, and the drive-use FETs 22, 122, each of which is formed by the plurality of the cells connected in parallel. However, as shown by the FET 2 as an example in FIG. 5, the source regions 26 and the drain regions 27 may be commonly used for the check-use FETs and the drive-use FETs, and a gate electrode of each of the plurality of cells may be divided into a check-use FET gate electrode (25a–25e) and a drive-use FET gate electrode. The check-use FET gate electrode is electrically insulated and isolated from the drive-use FET gate electrode. In this structure, each of the gate electrodes of the check-use FETs are sequentially connected to the bias power supply V3 by a switching circuit (not shown), and the voltage applied to the squib is detected. In this way, it is possible to carry out a diagnosis with respect to every check-use FETs which are established on each of the plurality of cells. As a result, the reliability of the diagnosis for the FET 2 can be enhanced.

Also, a check-use FET can be formed by connecting several divided gate electrodes in parallel as long as current flowing through the check-use FET is limited below the ignition current causing the ignition of the squib 10. Further, the gate electrode of each of the plurality of cells may be divided into not two but three or more. The increased divided gate electrodes are made a gate electrode of the check-use FET. In this case, because the check-use FETs occupies large area of the FET 2, the operation check can be carried out in the large area of the FET 2. It is to be noted that the check-use FETs are turned on along with the drive-use FETs when the squib is to be ignited.

In addition, the FETs 2, 12 can be made up of only plural check-use FETs. That is, the gate electrode of each of the plurality of cells in the FETs 2, 12 is divided into small pieces so that the ignition current does not flow through the squib 10, even when one of gate electrodes of the plural check use FETs is applied with a drive voltage. In this case, the operations of every FETs included in the FETs 2, 12 can be checked. Therefore, the reliability of the diagnosis for the FETs 2, 12 is further enhanced. When the vehicle collision is detected, all of the check-use FETs are simultaneously turned on to supply the ignition current to the squib 10.

When the FETs 2, 12 are composed of only plural check-use FETs, the plural check-use FETs may be formed by separated semiconductor devices. In other words, the plural check-use FETS may be formed on a common semiconductor substrate and may be formed on plural semiconductor substrates which are separated from one another.

What is claimed is:

1. A diagnosing apparatus for a passenger protective system comprising:

a squib for activating the passenger protective system;

a power transistor connected in series to at last one end of the squib to supply an igniting current to the squib, wherein the power transistor is made up of a plurality of transistor cells formed on a single substrate and connected in parallel, at least one of the plurality of transistor cells including a check transistor that allows a current less than that needed to ignite the squib to flow into the squib when the check transistor is turned on; and diagnosing means for diagnosing the power transistor based on a potential of the squib when the check transistor is turned on and at least one other of the plurality of transistor cells is turned off;

wherein each of the transistor cells has a drain region, a source region, a gate region and a gate electrode provided above the gate region, and wherein the check transistor is provided by separating the gate electrode of the at least one of the plurality of transistor cells into two sections, a first section being the gate electrode of the check transistor and the second section being the gate electrode for other than the check transistor, the first and second sections being connected separately from one another.

2. A diagnosing apparatus for a passenger protective system according to claim 1, wherein a first and a second power transistor are provided to respectively connect to each of two terminals of the squib.

3. A diagnosing apparatus for a passenger protective system according to claim 1, wherein the power transistor is provided on either side of the squib.

4. A diagnosing apparatus for a passenger protective system according to claim 1, wherein several check transistors are defined in the plurality of transistor cells of the power transistor and the several check transistors are sequentially turned on one by one when the diagnosing means diagnoses the power transistor.

5. A diagnosing apparatus for a passenger protective system according to claim 4, wherein source regions and drain regions in the plurality of transistor cells are commonly used for the several check transistors and the power transistor, and a gate electrode of each of the plurality of transistor cells is divided into a check transistor gate electrode and a power transistor gate electrode.

6. A diagnosing apparatus for a passenger protective system according to claim 1, wherein the check transistor and the power transistor are turned on when the squib is to be ignited.

7. A diagnosing apparatus for a passenger protective system according to claim 1, further comprising a switching circuit for providing a drive signal only to the check transistor when the power transistor is diagnosed and for providing drive signals to both the power transistor and the check transistor when the squib is to be ignited.

8. A diagnosing apparatus for a passenger protective system according to claim 7, further comprising switching circuit diagnosing means for detecting a potential at an output terminal of the switching circuit when the switching circuit is turned on or off, and for diagnosing the switching circuit based on the detected potential.

9. A diagnosing apparatus for a passenger protective system according to claim 1, further comprising a resistor connected to the power transistor, the resistor allowing current less than that needed to ignite the squib to flow therethrough.

10. A diagnosing apparatus for a passenger protective system according to claim 1, wherein the check transistor is defined in a cell including an end drain region connected to an end of a drain connecting line which connects drain regions of the plurality of transistor cells, and/or an end source region connected to an end of a source connecting line which connects source regions of the plurality of transistor cells.

11. A diagnosing apparatus for a passenger protective system according to claim 1, wherein the diagnosing means turns on the check transistors and turns off the other of the plurality of transistor cells.

12. A diagnosing apparatus for a passenger protective system according to claim 1, wherein the power transistor is a MOSFET, and the check transistor is formed in one transistor cell that is located at only one end of an arrangement of the plurality of transistor cells.

13. A diagnosing apparatus for a passenger protective system according to claim 1, wherein the power transistor is a MOSFET, and the gate electrodes of the transistor cells other than the check transistor are made of a single electrode layer.

14. A diagnosing apparatus for a passenger protective system according to claim 1, wherein the power transistor is a MOSFET, and the gate electrode of each of the plurality of transistor cells is separated into the two sections so that all the transistors cells are divided into the check transistor and a transistor other than the check transistor.

15. A diagnosing apparatus for a passenger system comprising:
   a squib for activating the passenger protective system;
   a transistor circuit connected in series to at least one end of the squib to supply an igniting current to the squib, the transistor circuit being made up of a plurality of transistors which are formed on a single substrate and connected in parallel to one another, at least one of the plurality of transistors being a check transistor which allows current less than that needed to ignite the squib to flow therethrough; and
   diagnosing means for diagnosing the transistor circuit based on a potential of the squib when the check transistor is turned on and at least one other of the plurality of transistors is turned of;
   wherein each of the transistors has a drain region, a source region, a gate region and a gate electrode provided to cover at least the gate region,
   wherein the gate electrode of the at least one of the plurality of transistors is separated into two sections, a first of the two sections being the gate electrode for the check transistor and a second of the two sections being the gate electrode for a transistor other than the check transistor, the check transistor and the transistor other than the check transistor having the drain region, the source region and the gate region of the at least one of the plurality of transistors in common.

16. A diagnosing apparatus for a passenger protective system according to claim 15, wherein the plurality of transistors are formed on a common semiconductor substrate.

17. A diagnosing apparatus for a passenger protective system according to claim 15, wherein the plurality of transistors includes several check transistors, and the several check transistors are turned on one by one by the diagnosing means.

18. A diagnosing apparatus for a passenger protective system according to claim 15, wherein the plurality of transistors are each check transistors, all of the plurality of transistors simultaneously turning on to ignite the squib.

19. A diagnosing apparatus for a passenger protective system according to claim 18, wherein the plurality of transistors are formed by separated semiconductor devices.

20. A diagnosing apparatus for a passenger protective system according to claim 15, wherein the diagnosing means turns on the check transistors and turns off the other of the plurality of transistors.

21. A diagnosing apparatus for a passenger protective system according to claim 15, wherein the power transistor is a MOSFET, and the check transistor is formed in one transistor cell that is located at only one end of an arrangement of the plurality of transistor cells.

22. A diagnosing apparatus for a passenger protective system according to claim 15, wherein the power transistor is a MOSFET, and the gate electrodes of the transistor cells other than the check transistor are made of a single electrode layer.

23. A diagnosing apparatus for a passenger protective system according to claim 15, wherein the power transistor is a MOSFET, and the gate electrode of each of the plurality of transistor cells is separated into the two sections so that all the transistor cells are divided into the check transistor and a transistor other than the check transistor.

24. A diagnosing apparatus for a passenger protective system comprising:
   a squib for activating the passenger protective system;
   a power transistor connected in series to at least one end of the squib to supply an igniting current to the squib, wherein the power transistor is made up of a plurality of transistor cells connected in parallel, at least several of the plurality of transistor cells being check transistors that each allow a current less than that needed to ignite the squib to flow into the squib when the check transistor is turned on; and
   diagnosing means for diagnosing the power transistor based on a potential of the squib when the check transistor is turned on and at least one other of the plurality of transistor cells is turned off;
   wherein the several check transistors are sequentially turned on one by one when the diagnosing means diagnosis the power transistor.

25. The diagnosing apparatus of claim 24, wherein source regions and drain regions in the plurality of transistor cells are commonly used for the several check transistors and the power transistor, and a gate electrode of each of the plurality of transistor cells is divided into a check transistor gate electrode and a power transistor gate electrode.

26. A diagnosing apparatus for a passenger system comprising:
   a squib for activating the passenger protective system;
   a transistor circuit connected in series to at least one end of the squib to supply an igniting current to the squib, wherein the transistor circuit is made up of a plurality of transistors which are connected in parallel to one another, at least several of the plurality of transistors being a check transistor that each allow current less than that needed to ignite the squib to flow therethrough; and
   diagnosing means for diagnosing the transistor circuit based on a potential of the squib when the check transistor is turned on and at least one other of the plurality of transistors is turned off;

wherein the several check transistors are turned on one by one by the diagnosing means.

27. A diagnosing apparatus for a passenger system comprising:

a squib for activating the passenger protective system;

a transistor circuit connected in series to at least one end of the squib to supply an igniting current to the squib, wherein the transistor circuit is made up of a plurality of transistors which are connected in parallel to one another, all of the plurality of transistors being check transistors which each allow current less than that needed to ignite the squib to flow therethrough; and diagnosing means for diagnosing the transistor circuit based on a potential of the squib when the check transistor is turned on and at least one other of the plurality of transistors is turned off;

wherein the plurality of transistors are simultaneously turned on to ignite the squib.

28. The diagnosing apparatus of claim 27, wherein the plurality of transistors are formed by separated semiconductor devices.

* * * * *